(12) United States Patent
Higashijima et al.

(10) Patent No.: US 10,475,671 B2
(45) Date of Patent: Nov. 12, 2019

(54) SUBSTRATE PROCESSING APPARATUS AND METHOD OF CLEANING SUBSTRATE PROCESSING APPARATUS

(71) Applicant: Tokyo Electron Limited, Tokyo (JP)

(72) Inventors: Jiro Higashijima, Kumamoto (JP); Nobuhiro Ogata, Kumamoto (JP); Yusuke Hashimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 216 days.

(21) Appl. No.: 15/390,902

(22) Filed: Dec. 27, 2016

(65) Prior Publication Data

US 2017/0200624 A1 Jul. 13, 2017

(30) Foreign Application Priority Data

Jan. 12, 2016 (JP) ................. 2016-003869

(51) Int. Cl.
| | |
|---|---|
| *H01L 21/67* | (2006.01) |
| *H01L 21/02* | (2006.01) |
| *B08B 3/10* | (2006.01) |
| *B08B 17/02* | (2006.01) |
| *C11D 11/00* | (2006.01) |

(52) U.S. Cl.
CPC .... *H01L 21/67051* (2013.01); *C11D 11/0047* (2013.01); *H01L 21/02041* (2013.01); *B08B 3/10* (2013.01); *B08B 17/025* (2013.01); *B08B 2203/0229* (2013.01)

(58) Field of Classification Search
CPC .. H01L 27/67051; B08B 3/048; B08B 17/025
See application file for complete search history.

(56) References Cited

U.S. PATENT DOCUMENTS

| | | | |
|---|---|---|---|
| 2001/0003067 A1* | 6/2001 | Kamikawa | ........ H01L 21/67051 438/758 |
| 2003/0010671 A1* | 1/2003 | Orii | ..................... C03C 23/0075 206/710 |

(Continued)

FOREIGN PATENT DOCUMENTS

| | | |
|---|---|---|
| JP | 11-176782 A | 7/1999 |
| JP | 2003-282417 A | 10/2003 |
| JP | 2006-024793 A | 1/2006 |

(Continued)

*Primary Examiner* — Mikhail Kornakov
*Assistant Examiner* — Natasha N Campbell
(74) *Attorney, Agent, or Firm* — Abelman, Frayne & Schwab

(57) ABSTRACT

Disclosed is a substrate processing apparatus including: a holding unit configured to hold a substrate; a processing liquid supply unit configured to supply a first processing liquid and a second processing liquid to the substrate; a first cup configured to recover the first processing liquid; a second cup disposed adjacent to the first cup and configured to recover the second processing liquid; a recovery portion defined by a peripheral wall portion that is erected on a bottom portion of the first cup; and a cleaning liquid supply unit configured to supply a cleaning liquid to the recovery portion. The peripheral wall portion is cleaned by causing the cleaning liquid supplied by the cleaning liquid supply unit to overflow from the peripheral wall portion to the second cup side.

13 Claims, 10 Drawing Sheets

(56) References Cited

U.S. PATENT DOCUMENTS

2012/0192899 A1* 8/2012 Higashijima ..... H01L 21/67017
  134/22.1
2012/0260946 A1* 10/2012 Ogata ............... H01L 21/67034
  134/18

FOREIGN PATENT DOCUMENTS

| JP | 2009-141280 A | 6/2009 |
| JP | 2012-178544 A | 9/2012 |
| JP | 2012-227285 A | 11/2012 |
| JP | 2013-089628 A | 5/2013 |
| JP | 2014-041994 A | 3/2014 |

* cited by examiner

SUBSTRATE PROCESSING APPARATUS AND METHOD OF CLEANING SUBSTRATE PROCESSING APPARATUS

CROSS-REFERENCE TO RELATED APPLICATIONS

This application is based on and claims priority from Japanese Patent Application No. 2016-003869 filed on Jan. 12, 2016 with the Japan Patent Office, the disclosure of which is incorporated herein in its entirety by reference.

TECHNICAL FIELD

Exemplary embodiments disclosed herein relate to a substrate processing apparatus and a method of cleaning a substrate processing apparatus.

BACKGROUND

Conventionally, a substrate processing apparatus has been known, which performs various processings on a substrate (e.g., a semiconductor wafer or a glass substrate) by supplying a predetermined processing liquid (see, e.g., Japanese Patent Laid-Open Publication No. 2013-089628).

The above-mentioned substrate processing apparatus is configured to receive, for example, a processing liquid scattered from the substrate in a cup, which is provided to surround the periphery of the substrate, and discharge the processing liquid. The cup includes, for example, a peripheral wall portion that is erected on the bottom portion of the cup, and employs a space defined by the peripheral wall portion as a recovery portion to recover and discharge the processing liquid.

Further, when there are a plurality of processing liquids, the substrate processing apparatus includes a plurality of cups depending on the kinds of the processing liquids. That is, in a case where a first processing liquid and a second processing liquid are supplied to the substrate, the substrate processing apparatus includes a first cup that recovers the first processing liquid, and a second cup that is disposed adjacent to the first cup and recovers the second processing liquid.

SUMMARY

A substrate processing apparatus according to an aspect of an exemplary embodiment includes a holding unit, a processing supply unit, a first cup, a second cup, a recovery portion, and a cleaning liquid supply unit. The holding unit holds a substrate. The processing liquid supply unit supplies a first processing liquid and a second processing liquid to the substrate. The first cup recovers the first processing liquid. The second cup is disposed adjacent to the first cup and recovers the second processing liquid. The recovery portion defined by a peripheral wall portion that is erected on a bottom portion of the first cup. The cleaning liquid supply unit supplies a cleaning liquid to the recovery portion. In the substrate processing apparatus, the peripheral wall portion is cleaned by causing the cleaning liquid supplied by the cleaning liquid supply unit to overflow from the peripheral wall portion to the second cup side.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
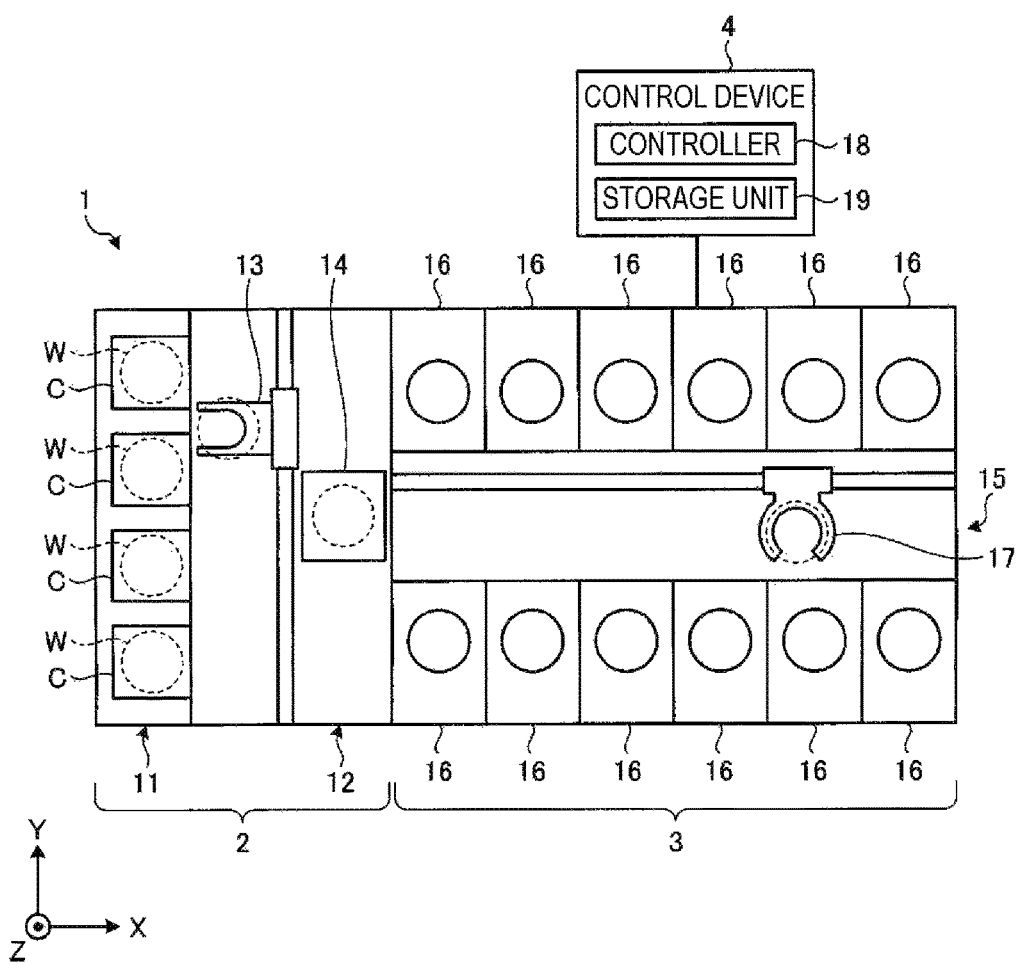
FIG. 1 is a view illustrating a schematic configuration of a substrate processing system according to a first exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the above-described substrate processing apparatus, when the processing liquid is discharged after various processings, for example, some of the first processing liquid may remain in the first cap. Similarly, some of the second processing liquid may remain in the second cup. In this case, it has been found that the remaining first and second processing liquids react with each other in the substrate processing apparatus to generate foreign matters (e.g., crystals), which are then attached to the peripheral wall portion of the first cup.

In an aspect of an exemplary embodiment, an object of the present disclosure is to provide a substrate processing apparatus and a method of cleaning a substrate processing apparatus, which are capable of removing the foreign matters attached to the peripheral wall portion of the cup.

A substrate processing apparatus according to an aspect of an exemplary embodiment includes a holding unit, a processing supply unit, a first cup, a second cup, a recovery portion, and a cleaning liquid supply unit. The holding unit holds a substrate. The processing liquid supply unit supplies a first processing liquid and a second processing liquid to the substrate. The first cup recovers the first processing liquid. The second cup is disposed adjacent to the first cup and recovers the second processing liquid. The recovery portion defined by a peripheral wall portion that is erected on a bottom portion of the first cup. The cleaning liquid supply unit supplies a cleaning liquid to the recovery portion. In the substrate processing apparatus, the peripheral wall portion is cleaned by causing the cleaning liquid supplied by the cleaning liquid supply unit to overflow from the peripheral wall portion to the second cup side.

In the above-described substrate processing apparatus, the first cup includes a liquid receiving portion provided above the peripheral wall portion to surround a periphery of the substrate held by the holding unit and configured to receive the first processing liquid scattered from the substrate, and the cleaning liquid supplied by the cleaning liquid supply unit is caused to overflow from a gap between the peripheral wall portion and the liquid receiving portion to the second cup side.

In the above-described substrate processing apparatus, the liquid receiving portion is movable up and down with respect to the peripheral wall portion, and the liquid receiving portion is moved down to such an extent that a site of the liquid receiving portion, which faces an upper surface of the peripheral wall portion is cleaned by the cleaning liquid when the cleaning liquid overflows from the peripheral wall portion.

In the above-described substrate processing apparatus, the first cup further includes: a support member configured to support the liquid receiving portion, and move up and down the liquid receiving portion with respect to the peripheral wall portion, and an insertion hole formed inside the peripheral wall portion to allow the support member to be inserted therethrough. The cleaning liquid supply unit is configured to clean the support member by introducing the cleaning liquid overflowing from the peripheral wall portion into the insertion hole.

In the above-described substrate processing apparatus, the first cup is connected to a circulation line that circulates the recovered first processing liquid and supplies to the substrate again, and the second cup is connected to a drain line that discharges the recovered second processing liquid to the outside of the apparatus.

The above-described substrate processing apparatus further includes a third cup disposed on an opposite side to the first cup across the second cup, and configured to recover a third processing liquid supplied from the processing liquid supply unit. A second recovery portion is defined by the peripheral wall portion and a second peripheral wall portion that is erected on a bottom portion of the second cup on an outer peripheral side of the peripheral wall portion, the cleaning liquid overflowing from the peripheral wall portion to the second cup side is recovered through the second recovery portion, and the second peripheral wall portion is cleaned by causing some of the recovered cleaning liquid to overflow from the second peripheral wall portion to the third cup side.

The above-described substrate processing apparatus further includes a drain pipe connected to the recovery portion and configured to discharge the first processing liquid recovered in the recovery portion; and a valve configured to control the discharge of the first processing liquid from the drain pipe. The cleaning liquid supply unit supplies the cleaning liquid from the drain pipe to the recovery portion when the cleaning liquid supply unit is connected to the drain pipe at a position of an upstream side of the valve in a flow direction and the valve is closed.

In the above-described substrate processing apparatus, the cleaning liquid supply unit includes a substrate nozzle that ejects a substrate cleaning liquid to clean the substrate, and the substrate nozzle supplies the substrate cleaning liquid as a cleaning liquid for cleaning the peripheral wall portion to the recovery portion.

In the above-described substrate processing apparatus, the cleaning liquid supply unit includes a holding mechanism nozzle that ejects a holding mechanism cleaning liquid to clean a holding mechanism including the holding unit, and the holding mechanism nozzle supplies the holding mechanism cleaning liquid as a cleaning liquid for cleaning the peripheral wall portion to the recovery portion.

In the above-described substrate processing apparatus, the first cleaning liquid includes a mixed solution of sulfuric acid and hydrogen peroxide, and a heat exchange unit is further provided to perform a heat exchange between the mixed solution and the cleaning liquid.

According to another an exemplary embodiment, the present disclosure provides a method of cleaning a substrate processing apparatus including: a holding unit configured to hold a substrate; a processing liquid supply unit configured to supply a first processing liquid and a second processing liquid to the substrate; a first cup configured to recover the first processing liquid; a second cup disposed adjacent to the first cup and configured to recover the second processing liquid; a recovery portion defined by a peripheral wall portion that is erected on a bottom portion of the first cup; and a cleaning liquid supply unit configured to supply a cleaning liquid to the recovery portion. The method includes supplying the cleaning liquid from the cleaning liquid supply unit to the recovery portion; and causing the supplied cleaning liquid to overflow from the peripheral wall portion to the second cup side so as to clean the peripheral wall portion.

In the above-described method, the first cup includes a liquid receiving portion provided above the peripheral wall portion to surround a periphery of the substrate held by the holding unit and configured to receive the first processing liquid scattered from the substrate, and the cleaning liquid supplied by the cleaning liquid supply unit is caused to overflow from a gap between the peripheral wall portion and the liquid receiving portion to the second cup side.

The above-described method, the first cup further includes: a support member configured to support the liquid receiving portion, and move up and down the liquid receiving portion with respect to the peripheral wall portion, and an insertion hole formed inside the peripheral wall portion to allow the support member to be inserted therethrough. The support member is cleaned by introducing the cleaning liquid overflowing from the peripheral wall portion into the insertion hole.

According to an aspect of the exemplary embodiment, it is possible to remove foreign matters attached to the peripheral wall portion of the cup.

Hereinafter, exemplary embodiments of a substrate processing apparatus and a substrate processing method disclosed herein will be described in detail with reference to the accompanying drawings. Further, the present disclosure is not limited to the following exemplary embodiments.

<1. Configuration of Substrate Processing System>
(First Exemplary Embodiment)

FIG. 1 is a view illustrating a schematic configuration of a substrate processing system according to an exemplary embodiment of the present disclosure. In the following, in order to clarify positional relationships, the X-axis, the Y-axis, and the Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14 therein. The substrate transfer device 13 is provided with a wafer holding mechanism configured to hold the wafer W. Further, the substrate transfer device 13 is movable horizontally and vertically and pivotable around a vertical axis. The substrate transfer device 13 transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the transfer unit 14. The wafer W placed on the transfer unit 14 is taken out from the transfer unit 14 by the substrate transfer device 17 of the processing station 3, and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
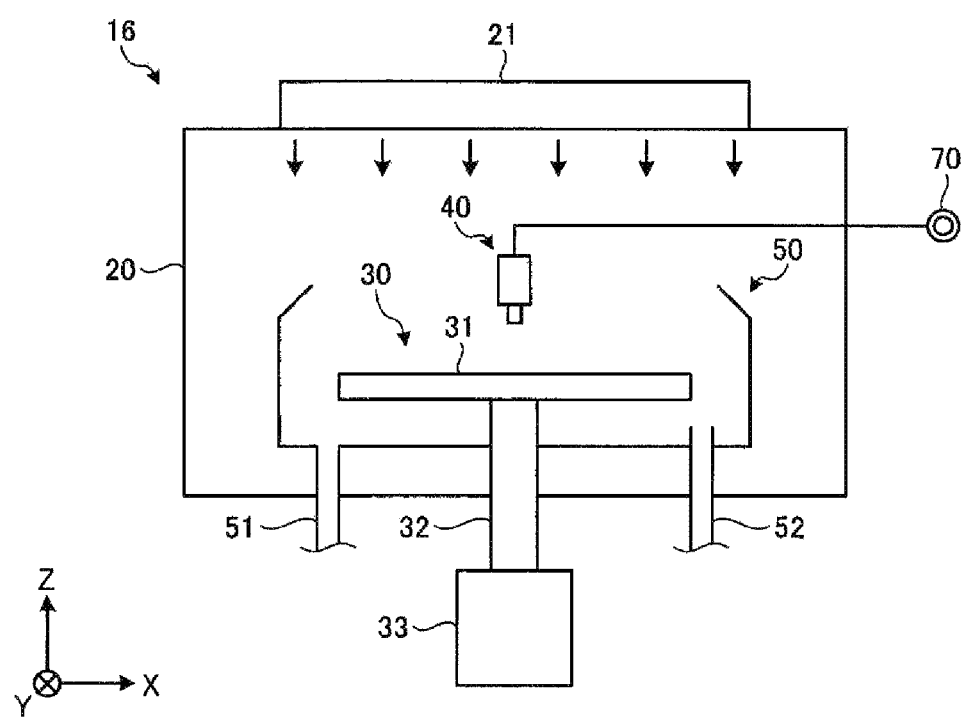
FIG. 2 is a view illustrating a schematic configuration of a processing unit.

Next, a schematic configuration of the processing unit 16 of the substrate processing system 1 will be described with reference to FIG. 2. FIG. 2 is a view illustrating a schematic configuration of a processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow within the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

<2. Specific Configuration of Processing Unit>

Figure 3:
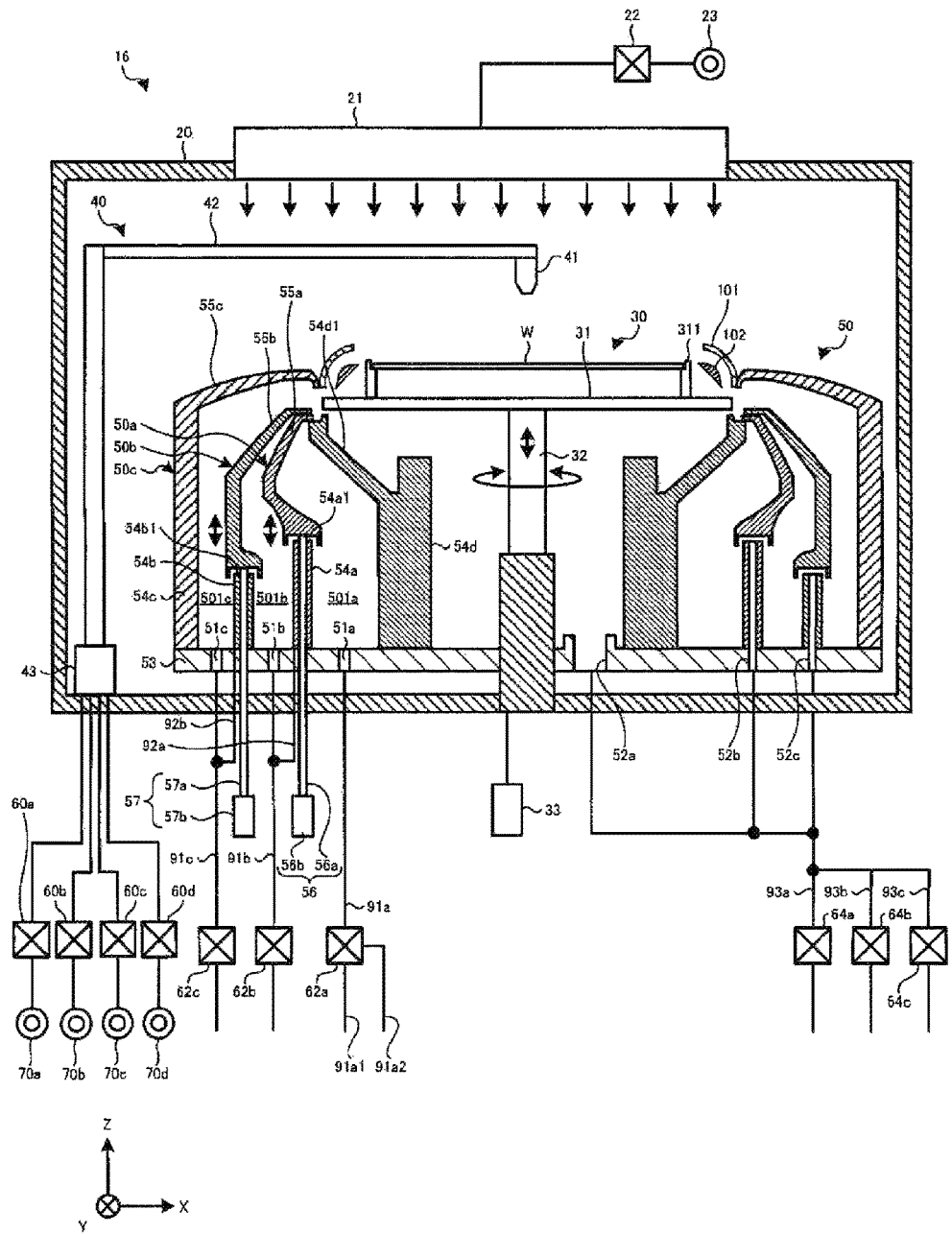
FIG. 3 is a schematic cross-sectional view illustrating a specific configuration of the processing unit.

Next, a specific configuration of the processing unit 16 will be described with reference to FIG. 3. FIG. 3 is a schematic cross-sectional view illustrating a specific configuration example of the processing unit 16.

As illustrated in FIG. 3, the FFU 21 is connected with an inert gas source 23 via a valve 22. The FFU 21 ejects an inert gas (e.g., $N_2$ gas), which is supplied from the inert gas source 23, into the chamber 20 as a downflow gas. Thus, when the inert gas is used as a downflow gas, the wafer W may be suppressed from being oxidized.

A holding member 311 is provided on the holding unit 31 of the substrate holding mechanism 30 to hold the wafer W from the lateral side. The wafer W is held horizontally in a state of being slightly spaced apart from the upper surface of the holding unit 31 by the holding member 311.

The processing fluid supply unit 40 includes a nozzle 41, an arm 42 that horizontally supports the nozzle 41, and a pivoting and lifting mechanism 43 that pivots and lifts the arm 42. One end of a pipe (not illustrated) is connected to the nozzle 41, and the other end of the pipe is branched into a plurality of pipes. Then, the ends of the branched pipes are connected with an alkaline processing liquid source 70a, an acidic processing liquid source 70b, an organic processing liquid source 70c, and a DIW source 70d, respectively. Further, one of valves 60a to 60d is provided between each of the sources 70a to 70d and the nozzle 41.

The processing fluid supply unit 40 supplies an alkaline processing liquid, an acidic processing liquid, an organic processing liquid, and a DIW (pure water at room temperature) supplied from the sources 70a to 70d, respectively, onto the front surface of the wafer W from the nozzle 41.

In the above description, the front surface of the wafer W is subjected to a liquid processing, but is not limited thereto. For example, the rear surface or the peripheral portion of the wafer W may be subjected to a liquid processing. In addition, in the present exemplary embodiment, the alkaline processing liquid, the acidic processing liquid, the organic processing liquid, and DIW are supplied from a single nozzle 41, but the processing fluid supply unit 40 may be provided with a plurality of nozzles corresponding to the processing liquids, respectively.

A first rotary cup 101 and a second rotary cup 102 are provided in the peripheral portion of the holding unit 31 to rotate integrally with the holding unit 31. As illustrated in FIG. 3, the second rotary cup 102 is disposed inside the first rotary cup 101.

The first rotary cup 101 and the second rotary cup are generally formed in a ring shape. As the first and second rotary cups 101, 102 are rotated along with the holding unit 31, the first and second rotary cups 101, 102 guide the processing liquid scattered from the rotating wafer W into the recovery cup 50.

The recovery cup 50 includes a first cup 50a, a second cup 50b, and a third cup 50c in this order from the inner side close to the rotation center of the rotating wafer W held by the holding unit 31. Further, the recovery cup 50 includes a cylindrical inner wall portion 54d around the rotation center of the wafer W, on the inner peripheral side of the first cup 50a.

The first to third cups 50a to 50c and the inner wall portion 54d are provided on a bottom portion 53 of the recovery cup 50. Specifically, the first cup 50a includes a first peripheral wall portion 54a and a first liquid receiving portion 55a.

The first peripheral wall portion 54a are erected on the bottom portion 53, and is formed in a tubular (e.g., cylindrical) shape. A space is defined between the first peripheral wall portion 54a and the inner wall portion 54d, and the space serves as a first drain groove 501a to recover and discharge, for example, the processing liquid. The first liquid receiving portion 55a is provided above an upper surface 54a1 of the first peripheral wall portion 54a.

Further, the first cup 50a includes a first lifting mechanism 56. Thus, the first cup 50a is liftable by the lifting mechanism 56. Particularly, the first lifting mechanism 56 includes a first support member 56a and a first lift driving unit 56b.

The first support member 56a is an elongated member. There is provided a plurality of (e.g., three (3)) first support member 56a, only one of which is illustrated in FIG. 3. The first support member 56a is movably inserted through an insertion hole formed inside the first peripheral wall portion 54. The first support member 56a may be, for example, a cylindrical rod, but is not limited thereto.

The first support member 56a is positioned such that the upper end thereof is exposed from the upper surface 54a1 of the first peripheral wall portion Ma, and connected to the lower surface of the first receiving portion 55a to support the first liquid receiving portion 55a from the lower side thereof. Meanwhile, the first lift driving unit 56b is connected to the lower end of the first support member 56a.

The first lift driving unit 56b lifts the first support member 56a, for example, in the Z-axis direction. Accordingly, the first support member 56a lifts the first liquid receiving portion 55a with respect to the first peripheral wall portion Ma. An air cylinder may be used as the first lift driving unit 56b. Further, the first lift driving unit 56b is controlled by the control device 4.

The first liquid receiving portion 55a driven by the first lift driving unit 56b is moved between a processing position where the processing liquid scattered from the rotating wafer W is received and a retreat position retreated from the processing position to the lower side.

Specifically, when the first liquid receiving portion 55a is positioned at the processing position, an opening is formed inside the upper end of the first liquid receiving portion 55a, and a flow path is formed to lead from the opening to the first drain groove 501a.

Meanwhile, as illustrated in FIG. 3, the inner wall portion 54d includes an extension 54d1 that extends to be inclined toward the peripheral edge portion of the holding unit 31. When the first liquid receiving portion 55a is positioned at the retreat position, the first liquid receiving portion 55a comes in contact with the extension 54d1 of the inner wall portion 54d, and the opening inside the upper end is closed so that the flow path leading to the first drain groove 501a is closed.

The second cup 50b has the same configuration as the first cup 50a. Specifically, the second cup 50b includes a second peripheral wall portion 54b, a second liquid receiving portion 55b, and a second lifting mechanism 57, and is disposed adjacent to the first peripheral wall portion 54a side of the first cup 50a.

The second peripheral wall portion 54b is erected on the outer peripheral side of the first peripheral wall portion 54a in the bottom portion 53, and formed in a tubular shape. In addition, a space defined between the second peripheral wall portion 54b and the first peripheral wall portion 54a serves as a second drain groove 501b to recover and discharge, for example, the processing liquid.

The second liquid receiving portion 55b is positioned on the outer peripheral side of the first liquid receiving portion 55a, and provided above an upper surface 54b1 of the second peripheral wall portion 54b.

The second lifting mechanism 57 includes a second support member 57a and a second lift driving unit 57b. The second support member 57a is an elongated member. There is provided a plurality of (e.g., three (3)) second support members 57a, only one of which is illustrated in FIG. 3, and movably inserted through an insertion hole formed in the second peripheral wall portion 54b. The second support member 57a may be, for example, a cylindrical rod, but not limited thereto.

The second support member 57a is positioned such that the upper end is exposed from the upper surface 54b1 of the first peripheral wall portion 54a, and connected to the lower surface of the second receiving portion 55b to support the second liquid receiving portion 55b from the lower side thereof. The upper surface 54b1 of the second peripheral wall portion 54b is positioned to be lower than the upper surface 54a1 of the first peripheral wall portion 54a in the vertical direction.

The second lift driving unit 57b is connected to the lower end of the second support member 57a. The second lift driving unit 57b lifts the second support member 57a, for example, in the Z-axis direction. Accordingly, the second support member 57a lifts the second liquid receiving portion 55b with respect to the second peripheral wall portion.

An air cylinder may be used as the second lift driving unit 57b. Further, the second lift driving unit 57b is also controlled by the control device 4.

In addition, the second liquid receiving portion 55b is also moved between the processing position and the retreat position. Specifically, when the second liquid receiving portion 55b is positioned at the processing position and the first liquid receiving portion 55a is positioned at the retreat position, an opening is formed inside the upper end of the second liquid receiving portion 55b, and a flow path is formed to lead from the opening to the second drain groove 501b.

Meanwhile, as illustrated in FIG. 3, when the second liquid receiving portion 55b is positioned at the retreat position, the second liquid receiving portion 55b comes in contact with the first liquid receiving portion 55a, and the opening inside the upper end is closed so that the flow path leading to the second drain groove 501b is closed. In the above description, the second liquid receiving portion 55b at the retreat position comes in contact with the first liquid receiving portion 55a, but is not limited thereto. For example, the second liquid receiving portion 55b at the retreat position may come in contact with the inner wall portion 54b to close the opening inside the upper end.

The third cup 50c includes a third peripheral wall portion 54c and a third liquid receiving portion 55c, and is disposed adjacent to an opposite side to the first cup 50a across the second cup 50b. The third peripheral wall portion 54c is erected on the outer peripheral side of the second peripheral wall portion 54b in the bottom portion 53, and formed in a tubular shape. In addition, a space defined between the third peripheral wall portion Mc and the second peripheral wall portion 54b serves as a third drain groove 501c to recover and discharge, for example, the processing liquid.

The third liquid receiving portion 55c is formed to be continuous from the upper end of the third peripheral wall portion Mc. The third liquid receiving portion 55c is formed to surround the periphery of the wafer W held by the holding unit 31 and extend up to the upper side of the first liquid receiving portion 55a or the second liquid receiving portion 55b.

In the third liquid receiving portion 55c, when the first and second liquid receiving portions 55a, 55b are positioned at the retreat position as illustrated in FIG. 3, an opening is formed inside the upper end of the third liquid receiving portion 55c, and a flow path is formed to lead from the opening to the third drain groove 501c.

Meanwhile, when the second receiving portion 55b is positioned at an ascending position, or when the firs liquid receiving portion 55a and the second liquid receiving portion 55b are positioned at an ascending position, the third liquid receiving portion 55c comes in contact with the second liquid receiving portion 55b, and the opening inside the upper end is closed so that the flow path leading to the third drain groove 501c is closed.

In the bottom portion 53 corresponding to the first to third cups 50a to 50c (more precisely, in the bottom portion 53 corresponding to the first to third drain grooves 501a to 501c), drain ports 51a to 51c are formed to be spaced apart from each other in the circumferential direction of the recovery cup 50.

Here, descriptions will be made on a case where the processing liquid discharged from the drain port 51a is an acidic processing liquid, the processing liquid discharged from the drain port 51b is an alkaline processing liquid, and the processing liquid discharged from the drain port 51c is an organic processing liquid. The kind of the processing liquids discharged from the respective drain ports 51a to 51c is merely illustrative, and is not limited thereto.

The drain port 51a is connected to a drain pipe 91a. A valve 62a is interposed in the drain pipe 91a, which is then branched into a first drain pipe 91a1 and a second drain pipe 91a2 at the position of the valve 62a. The valve 62a may be, for example, a three-way valve that is switchable between a valve closing position, a position of opening the discharge path to the first drain pipe 91a1 side, and a position of opening the discharge path to the second drain pipe 91a2 side.

When the acidic processing liquid is re-usable, the first drain pipe 91a1 is connected to the acidic processing liquid source 70b (e.g., a tank that stores the acidic processing liquid), so that the drained liquid returns to the acidic processing liquid source 70b. That is, the first drain pipe 91a1 functions as a circulation line. The second drain pipe 91a2 will be described later.

The drain port 51b is connected to a drain pipe 91b. A valve 62b is interposed in the middle of the drain pipe 91b. In addition, the drain port 51c is connected to a drain pipe 91c. A valve 62c is interposed in the middle of the drain pipe 91c. The valves 62b, 62c are controlled by the control device 4.

In addition, when performing a substrate processing, the processing unit 16 lifts the first liquid receiving portion 55a of the first cup 50a or the second liquid receiving portion 55b of the second cup 50b, depending on the kind of the processing liquid to be used in each processing during the substrate processing, to perform the switching of the drain ports 51a to 51c.

For example, when the wafer W is processed by ejecting the acidic processing liquid to the wafer W, the control device 4 opens the valve 60b in a state of rotating the holding unit 31 at a predetermined rotational speed by controlling the driving unit 33 of the substrate holding mechanism 30.

At this time, the control device 4 moves up the first cup 50a. That is, the control device 4 moves up the first and second support members 56a, 57a by the first and second lift driving units 56b, 57b and moves up the first liquid receiving portion 55a to the processing position, so that a flow path is formed to lead from the opening inside the upper end of the first receiving portion 55a to the first drain groove 501a. Thus, the acidic processing liquid supplied to the wafer W flows downward into the first drain groove 501a.

Further, the control device 4 controls the valve 62a to open the discharge path to the first drain pipe 91a1 side. Thus, the acidic processing liquid flowing into the first drain groove 501a returns to the acidic processing liquid source 70b through the drain pipe 91a and the first drain pipe 91a1. Then, the acidic processing liquid which has returned to the acidic processing liquid source 70b is supplied to the wafer W again. Therefore, the first cup 50a is connected to the circulation line that supplies the recovered acidic processing liquid to the wafer W again.

Further, for example, when the wafer W is processed by ejecting the alkaline processing liquid to the wafer W, the control device 4 similarly opens the valve 60a in a state of rotating the holding unit 31 at a predetermined rotational speed by controlling the driving unit 33.

At this time, the control device 4 moves up the second cup 50b only. That is, the control device 4 moves up the second support member 57a by the second lift driving unit 57b and moves up the second liquid receiving portion 55b to the processing position, so that a flow path is formed to lead from the opening inside the upper end of the second receiving portion 55b to the second drain groove 501b. Here, it is assumed that the first cup 50a is moved down. Thus, the alkaline processing liquid supplied to the wafer W flows downward into the second drain groove 501b.

Further, the control device 4 opens the valve 62b. Thus, the alkaline processing liquid in the second drain groove is discharged to the outside of the processing unit 16 through the drain pipe 91b. Therefore, the drain pipe 91b functions as a drain line that discharges the recovered second processing liquid to the outside of the processing unit 16. That is, the second cup 50b is connected to the drain line.

Further, for example, when the wafer W is processed by ejecting the organic processing liquid to the wafer W, the control device 4 similarly opens the valve 60c in a state of rotating the holding unit 31 at a predetermined rotational speed by controlling the driving unit 33.

At this time, the control device 4 moves up the first and second cups 50a, 50b (see, e.g., FIG. 3). That is, the control device 4 moves down the first and second support members 56a, 57a by the first and second lift driving units 56b, 57b and moves down the first and second liquid receiving portions 55a, 55b to the retreat position. Thus, a flow path is formed to lead from the opening inside the upper end of the first receiving portion 55c to the third drain groove 501c. Thus, the organic processing liquid supplied to the wafer W flows downward into the third drain groove 501c.

Further, the control device 4 opens the valve 62c, so that the organic processing liquid in the third drain groove 501c is discharged to the outside of the processing unit 16 through the drain pipe 91c. Therefore, the third cup 50c is also connected to a drain line that discharges the recovered third processing liquid to the outside of the processing unit 16 (e.g., the drain pipe 91c).

The discharge paths of the acidic processing liquid, the alkaline processing liquid, the organic processing liquid, and the cleaning liquid are illustrative, and are not limited thereto. That is, for example, the respective drain ports 51a to 51c may be connected to a single drain pipe. The single drain pipes may be provided with a plurality of valves depending on the property of the processing liquid (e.g., acidic or alkaline), and the discharge paths may be branched from the positions of the valves.

Further, the drain pipe 91b is connected with a drain pipe 92a in communication with the insertion hole through which the first support member 56a is inserted into the first peripheral wall portion 54a. The drain pipe 92a discharges, for example, a cleaning liquid infiltrated to the insertion hole of the first peripheral wall portion 54a (to be described later), and the cleaning liquid is discharged to the outside of the processing unit 16 through the drain pipe 91b.

Further, the drain pipe 91c is connected with a drain pipe 92b in communication with the insertion hole through which the second support member 57a is inserted into the second peripheral wall portion 54b. The drain pipe 92b discharges, for example, a cleaning liquid infiltrated to the insertion hole of the second peripheral wall portion 54b, and the cleaning liquid is discharged to the outside of the processing unit 16 through the drain pipe 91c.

Exhaust ports 52a, 52b, 52c are formed in the bottom portion of the recovery cup 50, the first peripheral wall portion 54a, and the second peripheral wall portion 54b, respectively. Further, the exhaust ports 52a, 52b, 52c are connected to a single exhaust pipe, and the exhaust pipe is branched into first to third exhaust pipes 93a to 93c at the downstream side of the exhaust. Further, a valve 64a is interposed in the first exhaust pipe 93a. A valve 64b is interposed in the second exhaust pipe 93b. A valve 64c is interposed in the third exhaust pipe 93c.

The first exhaust pipe 93a is an exhaust pipe for an acidic exhaust. The second exhaust pipe 93b is an exhaust pipe for an alkaline exhaust. The third exhaust pipe 93c is an exhaust pipe for an organic exhaust. These exhaust pipes are switched by the control device 4 depending on each process of the substrate processing.

For example, when performing a processing of generating an acidic exhaust, the switching to the first exhaust pipe 93a is performed by the control device 4, and the acidic exhaust is discharged via the valve 64a. Similarly, when performing a processing of generating an alkaline exhaust, the switching to the second exhaust pipe 93b is performed by the control device 4, and the alkaline exhaust is discharged via the valve 64b. Further, when performing a processing of generating an organic exhaust, the switching to the third exhaust pipe 93c is performed by the control device 4, and the organic exhaust is discharged via the valve 64c.

Hereinafter, in the present exemplary embodiment, it is assumed that SPM (a mixed solution of sulfuric acid and hydrogen peroxide) is used as the acidic processing liquid. Further, it is assumed that SC1 (a mixed solution of ammonia, hydrogen peroxide, and water) is used as the alkaline processing liquid, and isopropyl alcohol (IPA) is used as the organic processing liquid.

Further, SPM is an example of the first processing liquid. In addition, SC1 is an example of the second processing liquid, and IPA is an example of the third processing liquid. In addition, the kinds of the acidic processing liquid, the alkaline processing liquid, and the organic processing liquid are not limited to those described above.

However, when SPM and SC1 are used in the processing unit 16 as described above, it has been found that foreign matters (e.g., crystals) are attached to, for example, the first peripheral wall portion 54a of the first cup 50a.

Specifically, for example, when the wafer W is processed with SC1, the SC1 supplied to the wafer W is recovered by the second cup 50b, and then discharged through the drain pipe 91b. Further, when a processing is performed with SPM, the SPM supplied to the wafer W is recovered by the first cup 50a, and then discharged through the drain pipe 91a.

However, some of the SC1 or SPM may remain in the first cup 50a or the second cup 50b, depending on the discharge environment of the respective processing liquids. In that case, the remaining SC1 and SPM may react with each other to generate crystals.

Specifically, it has been found that the ammonia component of the SC1 and the sulfuric acid component of the SPM may react with each other to generate ammonium sulfate crystals, and the crystals may be attached to the first peripheral wall portion 54a of the first cup 50a as foreign matters. The crystals as described above are not limited to the combination of the SC1 and SPM, but may be generated by combinations of other kinds of processing liquids.

Therefore, the processing unit 16 according to the exemplary embodiment is configured to supply a cleaning liquid to, for example, the first peripheral wall portion 54a of the first cup 50a. As a result, the foreign matters (e.g., crystals) attached to, for example, the first peripheral wall portion 54a may be removed.

<3. Specific Configuration of Cleaning Liquid Supply Unit>

Figure 4A:
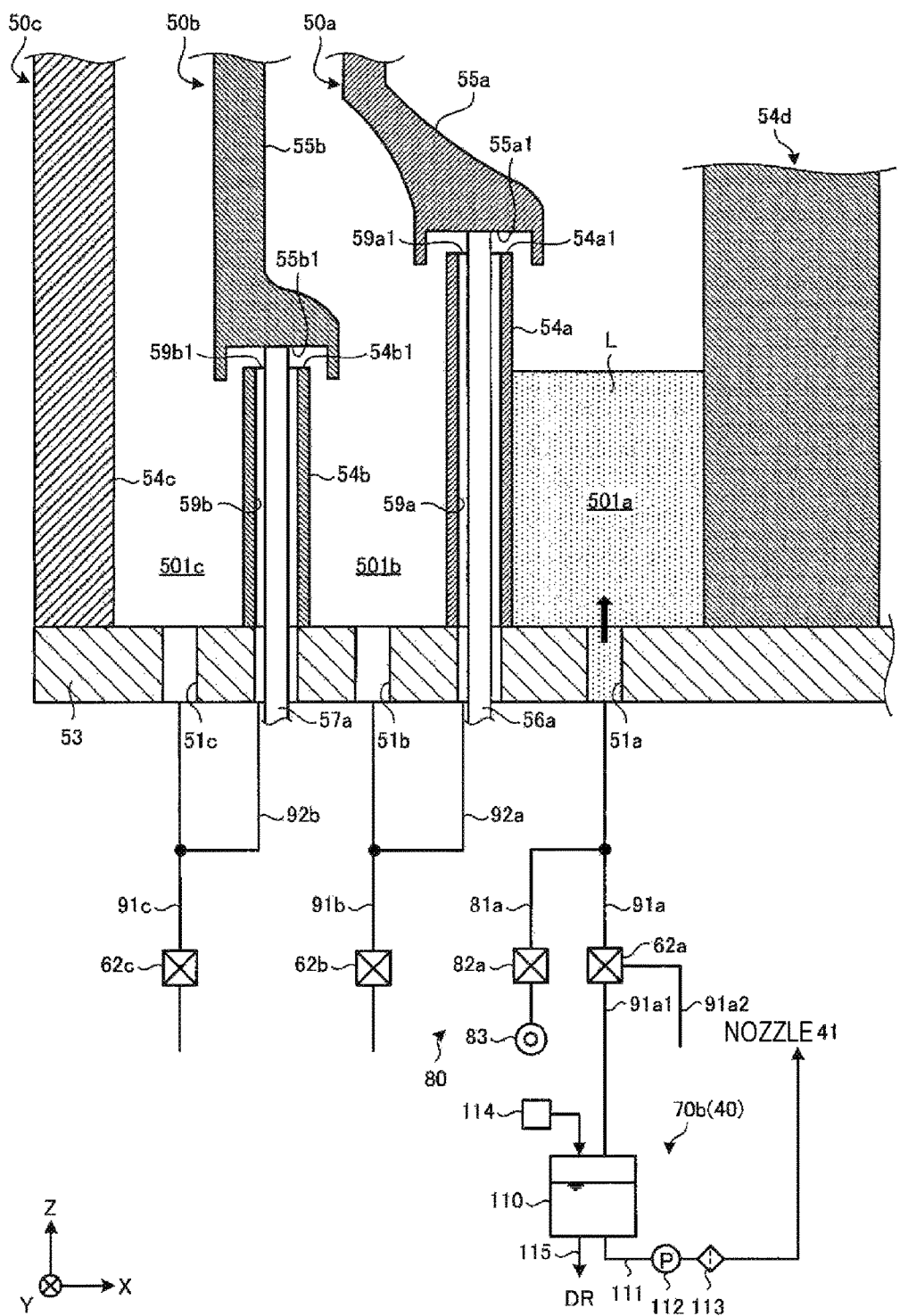
FIG. 4A is a view for explaining a configuration of a cleaning liquid supply unit and a cleaning processing.

Hereinafter, detailed descriptions will be made on a configuration of a cleaning liquid supply unit 80 that supplies a cleaning liquid to, for example, the first peripheral wall portion 54a with reference to FIG. 4A and subsequent drawings. FIG. 4A is a cross-sectional view for explaining a configuration of a cleaning liquid supply unit 80 and the first to third cups 50a to 50c in an enlarged scale.

As illustrated in FIG. 4A, the cleaning liquid supply unit 80 of the processing unit 16 includes a cleaning liquid supply pipe 81a and a valve 82a. One end of the cleaning liquid supply pipe 81a is connected to a cleaning liquid source 83, while the other end thereof is connected to the drain pipe 91a of the first cup 50a. Specifically, the valve 62a controls the discharge of the SPM in the drain pipe 91a, and the other end of the cleaning liquid supply pipe 81a is connected to the drain pipe 91a at a position of an upstream side of the valve 62a in a flow direction.

The valve 82a is provided in the cleaning liquid supply pipe 81a and is controlled by the control device 4. The cleaning liquid supplied by the cleaning liquid supply unit 80 may be DIW, but is not limited thereto.

Here, descriptions will be made on the drain pipe 91a to which the cleaning liquid supply pipe 81a is connected. Since the SPM (acidic processing liquid) flowing through the drain pipe 91a is reusable as described above, the SPM returns to the acidic processing liquid source 70b and is supplied from the acidic processing liquid source 70b to the wafer W again.

Specifically, as illustrated in FIG. 4A, the acidic processing liquid source 70b of the processing fluid supply unit 40 includes a tank 110 that stores the SPM, and a circulation line 111 that connects the tank 110 and the nozzle 41.

The tank 110 is connected with an end of the first drain pipe 91a1 on the back stream side of the drain pipe 91a, so that the SPM flowing through the first drain pipe 91a1 flows into the tank 110 and is stored therein. Further, the tank 110 is connected to a replenishment part 114 to replenish the SPM, and is also connected to a drain part 115 to discard the SPM in the tank 110.

A pump 112 is provided in the circulation line 111. The pump 112 pumps the SPM flowing out from the tank 110 toward the nozzle 41. Further, a filter 113 is provided in the circulation line 111 at the downstream side of the pump 112 to remove contaminants such as particles included in the SPM. An auxiliary equipment (e.g., a heater) may be further provided in the circulation line 111 as necessary.

Next, configurations of the first cup 50a and the second cup 50b will be further described. As illustrated in FIG. 4A, an insertion hole 59a through which the first support member 56a is inserted as described above is formed inside the first peripheral wall portion 54a of the first cup 50a. The insertion hole 59a includes an opening 59a1 formed on the upper surface 54a1 of the first peripheral wall portion 54a.

In addition, in the cup 50a, a space is defined between the first peripheral wall portion 54a and the first liquid receiving portion 55a, specifically, between the upper surface 54a1 of the first peripheral wall portion 54a and a lower surface 55a1 of the first liquid receiving portion 55a, which is a part facing the upper surface 54a1. The cleaning liquid may flow through this space, which will be described later. The first peripheral wall portion 54a is an example of the peripheral wall portion, and the first liquid receiving portion 55a is an example of the liquid receiving portion.

An insertion hole 59b through which the second support member 57a is inserted is formed inside the second peripheral wall portion 54b of the second cup 50b as well. The insertion hole 59b of the second peripheral wall portion 54b includes an opening 59b1 formed on the upper surface 54b1 of the second peripheral wall portion 54b.

In addition, in the cup 50b, a space is defined between the second peripheral wall portion 54b and the second liquid receiving portion 55b, specifically, between the upper surface 54b1 of the second peripheral wall portion 54b and the lower surface 55b1 of the second liquid receiving portion 55b, which is a part facing the upper surface 54b1, so that the cleaning liquid may flow therethrough.

Figure 4B:
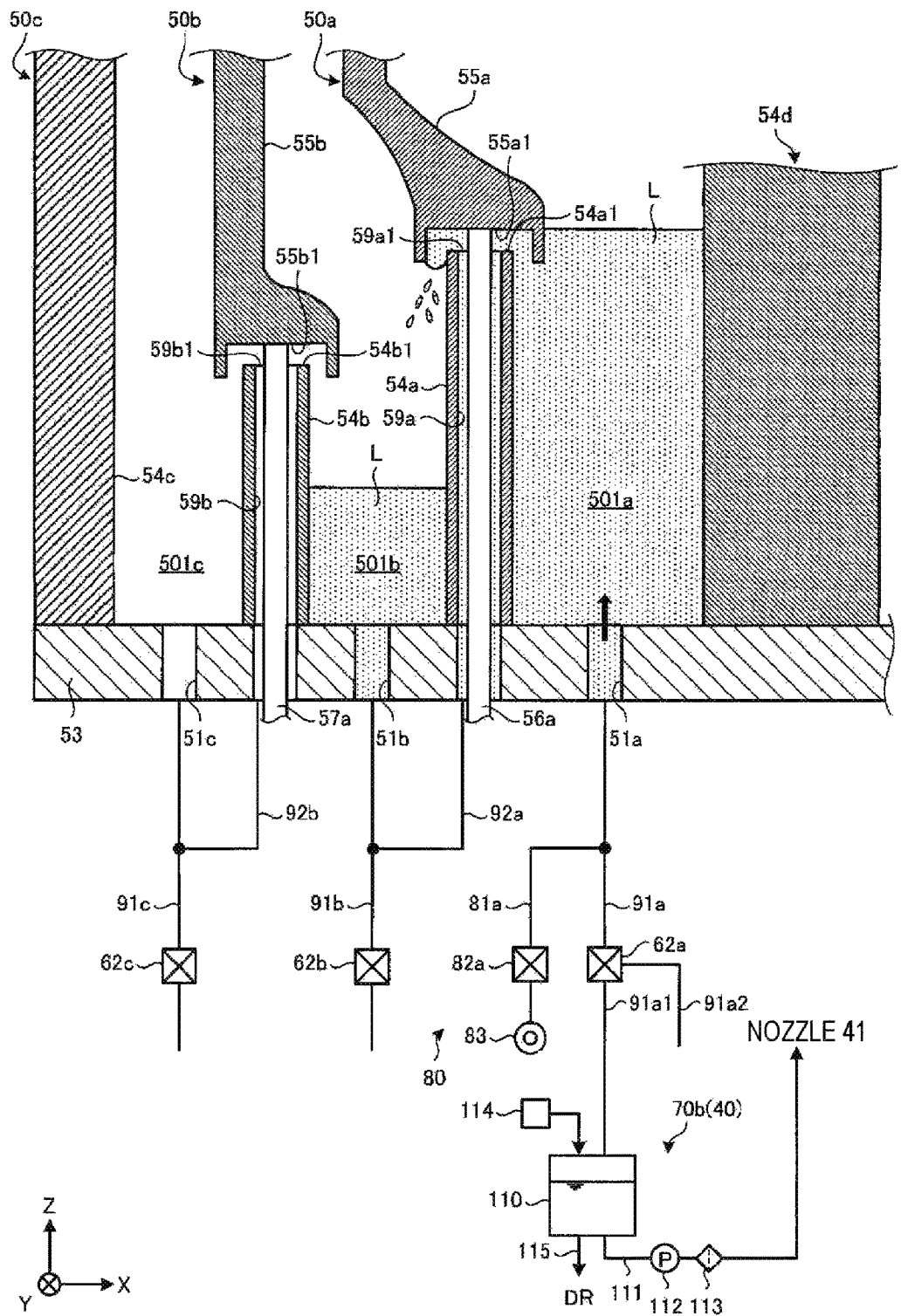
FIG. 4B is a view for explaining the cleaning processing.
Figure 4C:
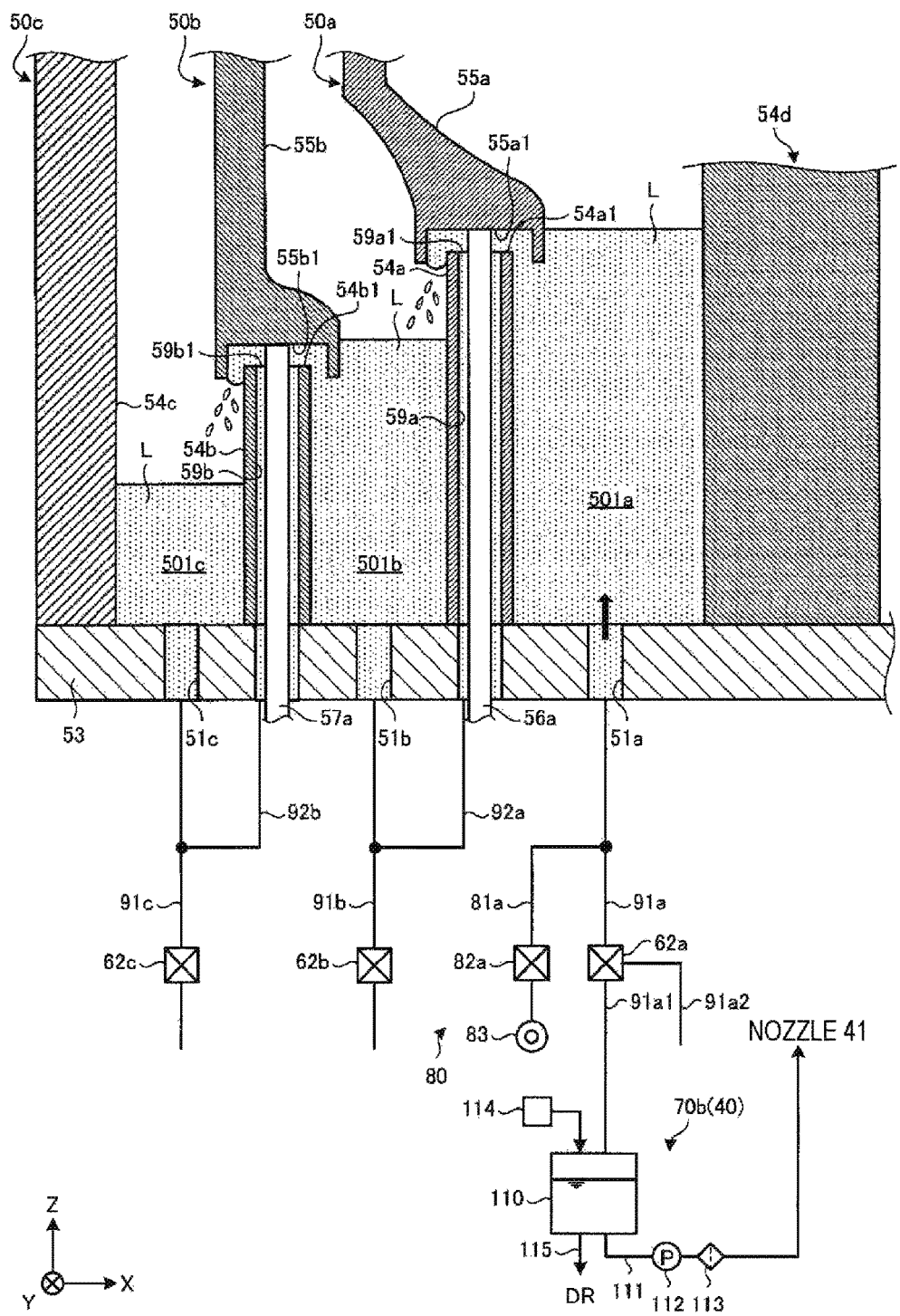
FIG. 4C is a view for explaining the cleaning processing.

Then, a cleaning processing is performed on, for example, the first peripheral wall portion 54a configured as described above. FIGS. 4A, 4B, and 4C are views for explaining the cleaning processing in the exemplary embodiment.

More specifically, the control device 4 opens the valve 82a when performing the cleaning processing of, for example, the first peripheral wall portion 54a. At this time, the control device 4 closes the valve 62a, the valve 62b, and the valve 62c.

Therefore, as illustrated in FIG. 4A, a cleaning liquid L of the cleaning liquid source 83 is ejected from the drain port 54a to the first drain groove 501a through the cleaning liquid supply pipe 81a, the valve 82a, and the drain pipe 91a. Thus, the cleaning liquid supply unit 80 supplies the cleaning liquid L from the drain pipe 91a to the first drain groove 501a of the first cup 50a when, for example, the valve 62a is closed. The first drain groove 501a is an example of the recovery portion.

Then, the cleaning liquid L supplied by the cleaning liquid supply unit 80 is stored in the first drain groove 501a, and the liquid level gradually rises. Further, when the cleaning liquid L is supplied by the cleaning liquid supply unit 80, and the liquid level of the cleaning liquid L reaches the upper surface 54a1 of the first peripheral wall portion 54a, the cleaning liquid L runs over the upper surface 54a1 of the first peripheral wall portion 54a and overflows from the first peripheral wall portion 54a toward the second cup 50b side. The overflowing cleaning liquid L is stored in the second drain groove 501b of the second cup 50b, and the liquid level thereof gradually rises.

As a result, the upper surface 54a or the lateral surface of the first peripheral wall portion 54a is cleaned by the cleaning liquid L, and thus, the foreign matters (e.g., crystals) attached to the first peripheral wall portion 54a may be removed. Since the crystals of ammonium sulfate have a relatively high water solubility, the crystals are removed while being dissolved in the cleaning liquid L.

Further, since a space is defined between the first peripheral wall portion 54a and the first liquid receiving portion 55a as described above, the cleaning liquid L overflows from the first peripheral wall portion 54a toward the second cup 50b side while flowing through the space between the first peripheral wall portion 54a and the first liquid receiving portion 55a. Therefore, in the exemplary embodiment, the cleaning liquid L supplied by the cleaning liquid supply unit 80 overflows from the space between the first peripheral wall portion 54a and the first liquid receiving portion 55a toward the second cup 50b side. As a result, the foreign matters (e.g., crystals) present in the space between the first peripheral wall portion 54a and the first liquid receiving portion 55a may also be removed.

Further, when the cleaning liquid L overflows from the first peripheral wall portion Ma, the first liquid receiving portion 55a may be moved down to such an extent that a part of the first liquid receiving portion 55a, which faces the upper surface 54a1 of the first peripheral wall portion Ma, is cleaned by the cleaning liquid L. That is, as illustrated in FIG. 4B, for example, when the first liquid receiving portion 55a is moved down to the retreat position, the cleaning liquid L overflowing from the first peripheral wall portion 54a is supplied to the part of the first liquid receiving portion 55a, which faces the upper surface 54a1 of the first peripheral wall portion Ma, that is, the lower surface 55a1. As a result, foreign matters attached to the lower surface 55a1 of the first peripheral wall portion 55a may be removed.

The wording "the first liquid receiving portion 55a is moved down to such an extent that the part of the liquid receiving portion 55a, which faces the upper surface Ma1 of the peripheral wall portion Ma, is cleaned by the cleaning liquid L" means that the first liquid receiving portion 55a is moved down such that the upper surface Ma1 of the first peripheral wall portion 54a and the lower surface 55a1 of the first liquid receiving portion 55a are spaced apart up to a distance where the cleaning liquid L splashes onto the lower surface 55a1, but is not limited thereto.

Further, the part on the upper surface 54a1 of the first peripheral wall portion 54a or the lower surface 55a1 of the first liquid receiving portion 55a and the part between the first peripheral wall portion 54a and the first liquid receiving portion 55a are areas to which the mixed liquid of the SPM remaining in the first cup 50a and the SC1 remaining in the second cup 50b is likely to be attached. In the exemplary embodiment, cleaning is performed by supplying the cleaning liquid L to a part to which the mixed liquid of the SPM and the SC1 may be attached to generate crystals.

That is, in the exemplary embodiment, the part of the peripheral wall portion 54a to be cleaned by the cleaning liquid supply unit 80 includes a part to which the mixed liquid of the SPM (the first processing liquid) and the SC1 (the second processing liquid) is attached. Therefore, it is possible to clean a part of the first peripheral wall portion 54a to which foreign matters (e.g., crystals) are likely to be attached, thereby effectively removing the foreign matters.

Further, the foreign matters (e.g., crystals) may be attached to, for example, the first support member 56a in addition to the first peripheral wall portion 54a. Therefore, the cleaning liquid supply unit 80 according to the exemplary embodiment also cleans the first support member 56a by supplying the cleaning liquid L thereto.

Specifically, the insertion hole 59a according to the exemplary embodiment has the opening 59a1 formed on the upper surface 54a1 of the first peripheral wall portion 54a as described above. Thus, as illustrated in FIG. 4B, the cleaning liquid L overflowing to the second cup 50b along the upper surface 54a1 of the first peripheral wall portion 54a flows from the upper surface Ma1 into the insertion hole 59a through the opening 59a1 and remains in the insertion hole 59a. Therefore, the outer periphery of the first support member 56a and the insertion hole 59a may be cleaned so that foreign matters attached to the outer periphery of the first support member 56a and the insertion hole 59a may be removed.

Descriptions have been made on the case of performing the cleaning processing in a state where the first liquid receiving portion 55a is moved down, but the present disclosure is not limited thereto. The cleaning processing may be performed in a state where the first liquid receiving portion 55a is moved up.

Further, the control device 4 may control the first lift driving unit 56b to move up the first support member 56a and performs the cleaning processing while moving up and down the first liquid receiving portion 55a. Therefore, the first support member 56a is moved inside the insertion hole 59a which is filled with the cleaning liquid L. Thus, foreign matters attached to the outer periphery of the first support member 56a may be efficiently removed.

Further, when the cleaning liquid L is supplied from the cleaning liquid supply unit 80, the liquid level of the cleaning liquid L in the second drain groove 501b reaches the upper surface 54b1 of the second peripheral wall portion 54b. The second drain groove 501b is an example of the second recovery portion.

Therefore, as illustrated in FIG. 4C, the cleaning liquid L runs over the upper surface 54b1 of the second peripheral wall portion 54b and overflows from the second peripheral wall portion 54b toward the third cup 50c side. The overflowing cleaning liquid L is stored in the third drain groove 501c of the third cup 50c.

Therefore, in the exemplary embodiment, the cleaning liquid L overflowing from the first liquid receiving portion 55a to the second cup 50b is recovered by the second drain groove 501b of the second cup 50b. Then, some of the recovered cleaning liquid L overflows from the second peripheral wall portion 54b to the third cup 50c.

As a result, the upper surface 54b1 or the lateral surface of the second peripheral wall portion 54b is cleaned by the cleaning liquid L, and thus, the foreign matters attached to the second peripheral wall portion 54b may be removed. Further, since the cleaning liquid L flows through the space between the second peripheral wall portion 54b and the second liquid receiving portion 55b as in the first peripheral wall portion Ma, the foreign matters present in the space between the second peripheral wall portion 54b and the second liquid receiving portion 55b may also be removed.

Further, when the cleaning liquid L overflows from the second peripheral wall portion 54b, the second liquid receiving portion 55b may be moved down to such an extent that a part of the second liquid receiving portion 55b, which faces the upper surface 54b1 of the second peripheral wall portion 54b, is cleaned by the cleaning liquid L. That is, as illustrated in FIG. 4C, for example, when the second liquid receiving portion 55b is moved down to the retreat position, the cleaning liquid L overflowing from the second peripheral wall portion 54b is supplied to the lower surface 55b1 of the second liquid receiving portion 55b. As a result, foreign matters attached to the lower surface 55b1 of the second peripheral wall portion 55b may be removed.

Further, as illustrated in FIG. 4C, the cleaning liquid L overflowing to the third cup 50c along the upper surface 54b1 of the second peripheral wall portion 54b flows from the upper surface 54b1 into the insertion hole 59b through the opening 59b1 and remains in the insertion hole 59b. Therefore, the outer periphery of the second support member 57a and the insertion hole 59b may be cleaned so that foreign matters attached to the outer periphery of the second support member 57a and the insertion hole 59b may be removed.

As in the case of the first liquid receiving portion 55a, the cleaning processing may be performed in a state where the second liquid receiving portion 55b is moved up. Alternatively, the cleaning processing may be performed while moving up and down the second liquid receiving portion 55b.

Further, since the processing unit 16 according to the exemplary embodiment has a configuration as described above, the cleaning liquid L after the cleaning, which contains SC1 or IPA, may be suppressed from flowing into the acidic processing liquid source 70b serving as a source of SPM.

Specifically, the cleaning liquid supply unit 80 supplies the cleaning liquid L to the first drain groove 501a of the first cup 50a connected with the drain pipe 91a serving as a circulation line of SPM. Then, the cleaning liquid L supplied to the first cup 50a overflows sequentially to the second cup 50b and the third cup 50c connected with the drain pipes 91b, 91c, respectively, which serve as drain lines.

Thus, for example, the cleaning liquid L after the cleaning, which contains the SC1 remaining in the second drain groove 501b, flows from the second cup 50b to the third cup 50c, but does not flow into the first cup 50a. Similarly, the cleaning liquid L after the cleaning, which contains the IPC remaining in the third drain groove 501c, remains in the third cup 50c, but does not flow from the third cup 50c into the second cup 50b or the first cup 50a.

Therefore, the cleaning liquid L after the cleaning, which contains SC1 or IPA, may be suppressed from flowing into the acidic processing liquid source 70b serving as a source of SPM. Since the SC1 or the IPA is suppressed from being incorporated into the acidic processing liquid source 70b serving as a source of SPM, the recovered SPM may be reused for the supply to the wafer W.

Further, as described above, the upper surface 54b1 of the second peripheral wall portion 54b is positioned below the upper surface 54a1 of the first peripheral wall portion 54a in the vertical direction. Thus, since the cleaning liquid L after the cleaning, which remains in the second drain groove 501b of the second cup 50b, securely overflow to the third cup 50c side, the cleaning liquid L may be suppressed from flowing into the first cup 50a side. Therefore, the cleaning liquid L after the cleaning, which contains, for example, SC1, may be further suppressed from flowing into the acidic processing liquid source 70b serving as a source of SPM.

<4. Specific Configuration of Substrate Processing System>

Next, descriptions will be made on the contents of a substrate processing performed in the substrate processing system 1 according to the exemplary embodiment with reference to FIG. 5.

Figure 5:
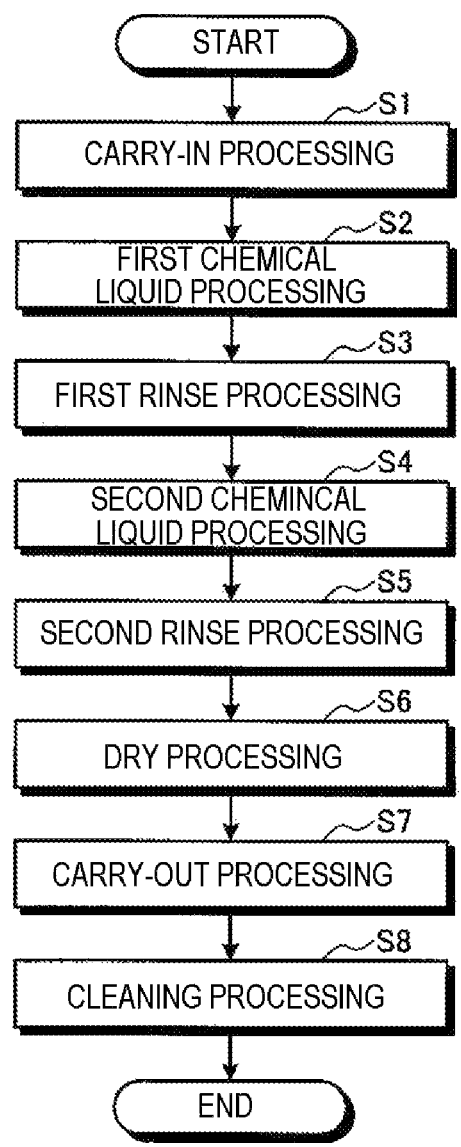
FIG. 5 is a flowchart illustrating a processing procedure of the processing performed in the substrate processing system according to the first exemplary embodiment.

FIG. 5 is a flowchart illustrating a processing procedure of the processing performed in the substrate processing system 1 according to the exemplary embodiment. The processing procedure illustrated in FIG. 5 is performed according to the control of the controller 18 of the control device 4.

As illustrated in FIG. 5, the processing unit 16 first performs a carry-in processing of a wafer W (step S1). In the carry-in processing, the wafer W is placed on the holding unit 31 by the substrate transfer device 17 (see, e.g., FIG. 1), and the wafer W is then held by the holding unit 31.

Subsequently, the processing unit 16 performs a first chemical liquid processing (step S2). In the first chemical liquid processing, the controller 18 first causes the driving unit 33 to rotate the holding unit 31 so that the wafer W is rotated. Subsequently, the controller 18 opens the valve 60a for a predetermined time period to supply SC1 from the nozzle 41 to the front surface of the wafer W. Thus, the front surface of the wafer W is processed with the SC1.

Subsequently, the processing unit 16 performs a first rinse processing (step S3). In the first rinse processing, the controller 18 opens the valve 60d for a predetermined time period to supply DIW from the nozzle 41 to the wafer W. Thus, the SC1 remaining on the wafer W is washed out with the DIW.

Next, the processing unit 16 performs a second chemical liquid processing (step S4). In the second chemical liquid processing, the controller 18 opens the valve 60b for a predetermined time period to supply SPM from the nozzle 41 to the front surface of the wafer W. Thus, the front surface of the wafer W is processed with the SPM.

Subsequently, the processing unit 16 performs a second rinse processing (step S5). In the second rinse processing, the controller 18 opens the valve 60d for a predetermined time period to supply DIW from the nozzle 41 to the front surface of the wafer W. Thus, the SPM remaining on the wafer W is washed out with the DIW.

Next, the processing unit 16 performs a dry processing (step S6). In the dry processing, the controller 18 opens the valve 60c for a predetermined time period to supply IPA from the nozzle 41 to the front surface of the wafer W. Thus, the DIW remaining on the front surface of the wafer W is replaced with the IPA which is more volatile than the DIW. Thereafter, the IPA on the wafer W is shaken off so that the wafer W is dried.

Subsequently, the processing unit 16 performs a carry-out processing (step S7). In the carry-out processing, the controller 18 stops the rotation of the wafer W caused by the driving unit 33, and then, the wafer W is carried out of the processing unit 16 by the substrate transfer device 17 (see, e.g., FIG. 1). When the carry-out processing is completed, a series of substrate processings on one wafer W is completed.

Next, the processing unit 16 performs a cleaning processing to clean, for example, the first peripheral wall portion 54a (step S8). The cleaning processing is not required to be performed whenever one wafer W is carried out. That is, a timing of performing the cleaning processing may be arbitrarily set. For example, the cleaning processing may be performed once after the substrate processing is performed on a plurality of wafers W. Further, the cleaning of the substrate holding mechanism 30 (to be described later) may be performed at the time of the processing of step S8.

Figure 6:
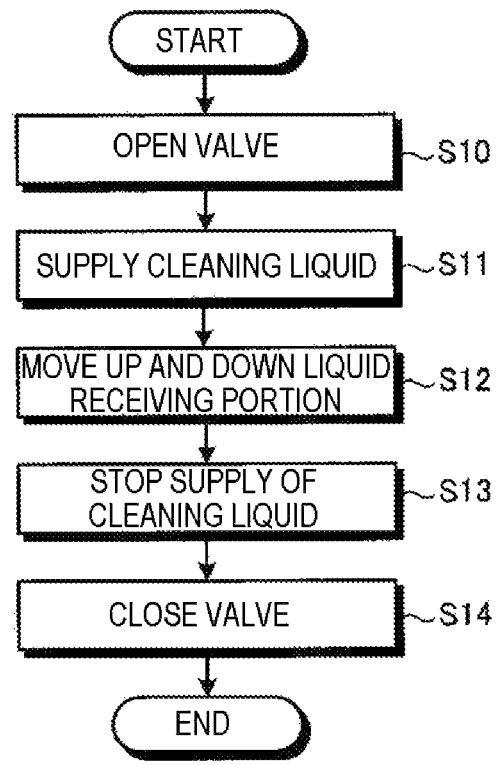
FIG. 6 is a flowchart illustrating an exemplary processing procedure of a cleaning processing of the first peripheral wall portion performed in the substrate processing system.

The cleaning processing of, for example, the first peripheral wall portion 54a will be described with reference to FIG. 6. FIG. 6 is a flowchart illustrating an exemplary processing procedure of the cleaning processing of, for example, the first peripheral wall portion performed in the substrate processing system 1.

As illustrated in FIG. 6, the controller 18 of the control device 4 closes the valves 62a, 62b, 62c (step S10). Subsequently, the controller 18 opens the valve 82a of the cleaning liquid supply unit 80 to supply the cleaning liquid L to the first drain groove 501a of the first cup 50a (step S11). Thus, the cleaning liquid L remains in the first drain groove 501a of the first cup 50a. The cleaning liquid L stored in the first drain groove 501a overflows to the second cup 50b and the third cup 50c with the lapse of time, so that the first peripheral wall portion 54a or the second peripheral wall portion 54b is cleaned.

Next, the controller 18 moves up and down the first and second liquid receiving portions 55a, 55b by driving the first and second support members 56a, 57a by the first and second lift driving units 56b, 57b (step S12). When the first and second liquid receiving portions 55a, 55b are moved up and down in this manner, the first and second support members 56a, 57a are moved inside the insertion holes 59a, 59b, respectively, which are filled with the cleaning liquid L, thereby being efficiently cleaned.

The processing of step S12 is not necessarily required. For example, the first peripheral wall portion 54a may be cleaned in a state where the first and second liquid receiving portions 55a, 55b are moved up or down without performing the processing of step S12.

Subsequently, when a predetermined time period has elapsed and the cleaning of, for example, the first peripheral wall portion 54a is completed, the control section 18 closes the valve 82a of the cleaning liquid supply unit 80 to stop the supply of the cleaning liquid L to the first drain groove 501a (step S13).

Next, the controller 18 opens the valves 62a, 62b, 62c (step S14). In step S14, the valve 62a is opened such that the discharge path is opened to the second drain pipe 91a2 side.

Thus, the cleaning liquid L after the cleaning in the first drain groove 501a is discharged to the outside of the processing unit 16 through the drain pipe 91a, the valve 62a, and the second drain pipe 91a2. Further, the cleaning liquid L after the cleaning in the second drain groove 501b and the insertion hole 59a flows to the valve 62b through the drain pipe 91b or the drain pipe 92a and is discharged to the outside of the processing unit 16. Similarly, the cleaning liquid L after the cleaning in the third drain groove 501c and the insertion hole 59b flows to the valve 62c through the drain pipe 91c or the drain pipe 92b and is discharged to the outside of the processing unit 16. Therefore, the cleaning processing of, for example, the first peripheral wall portion 54a is completed.

In the above descriptions, after the valves 62a, 62b, 62c are closed in step S10, the supply of the processing liquid L is started in step S11, but the present disclosure is not limited thereto. That is, for example, the processings of steps S10 and S11 may be performed at the same time, or the processing of step S10 may be performed after the processing of step S11.

Further, after the supply of the cleaning liquid L is stopped in step S13, the valves 62a, 62b, 62c are opened in step S14, but the present disclosure is not limited thereto. The processings of steps S13 and S14 may be performed at the same time, or the processings of steps S14 and S13 may be performed sequentially in this order.

In addition, in the above descriptions, the valve 62c is closed and the cleaning processing is performed, but the present disclosure is not limited thereto. For example, the cleaning processing may be performed while sequentially discharging the cleaning liquid L after the cleaning, which flows into the third cup 50c or the insertion hole 59b.

Further, the supply amount of the cleaning liquid L supplied from the cleaning liquid supply unit 80 to the first drain groove 501a may be set to be larger than the discharge amount of the cleaning liquid L discharged from the drain pipes 91a, 91b, 91c. When the supply amount of the cleaning liquid L is set in this manner, even though the valves 62a, 62b, 62c are opened, the cleaning liquid L may overflow from the first cup 50a to the second cup 50b and the third cup 50c so that, for example, the first peripheral wall portion 54a may be cleaned.

As described above, the processing unit 16 according to the first exemplary embodiment (corresponding to an example of the "substrate processing apparatus") includes the holding unit 31, the processing fluid supply unit 40 (corresponding to an example of the "processing liquid supply unit"), the first cup 50a, the second cup 50b, and the cleaning liquid supply unit 80. The holding unit 31 holds the wafer W. The processing fluid supply unit 40 supplies SPM (the first processing liquid) and SC1 (the second processing liquid) to the wafer W.

The first cup 50a includes the first peripheral wall portion 54a and recovers the SPM from the first drain groove 501a formed by the first peripheral wall portion 54a. The second cup 50b is disposed adjacent to the first cup 50a and recovers the SC1. The cleaning liquid supply unit 80 supplies the cleaning liquid L to the first drain groove 501a of the first cup 50a. In the processing unit 16, the cleaning liquid L supplied by the cleaning liquid supply unit 80 overflows from the first peripheral wall portion 54ato the second cup 50b so that the first peripheral wall portion 54ais cleaned. As a result, the foreign matters attached to the first peripheral wall portion 54aof the first cup 50a may also be removed.

In addition, the cleaning liquid supply unit 80 supplies the cleaning liquid L from the drain pipe 91a to the first drain groove 501a of the first cup 50a when the valve 62a is closed. Therefore, with the simple configuration in which the cleaning liquid supply pipe 81a is connected to the drain pipe 91a, the cleaning liquid L may be supplied to the first drain groove 501a of the first cup 50a.

In the above descriptions, the cleaning liquid L is supplied from the drain pipe 91a to the first drain groove 501a, but the present disclosure is not limited thereto. That is, although not illustrated, for example, a nozzle may be disposed at a position directed to the first drain groove 501a, and the cleaning liquid L may be supplied from the nozzle directly to the first drain groove 501a.

<5. Modification>

Next, descriptions will be made on first to third modifications of the processing unit 16 according to the first exemplary embodiment. In the processing unit 16 in the first to third modifications, the supply path of the cleaning liquid L to the first drain groove 501a is changed.

Figure 7:
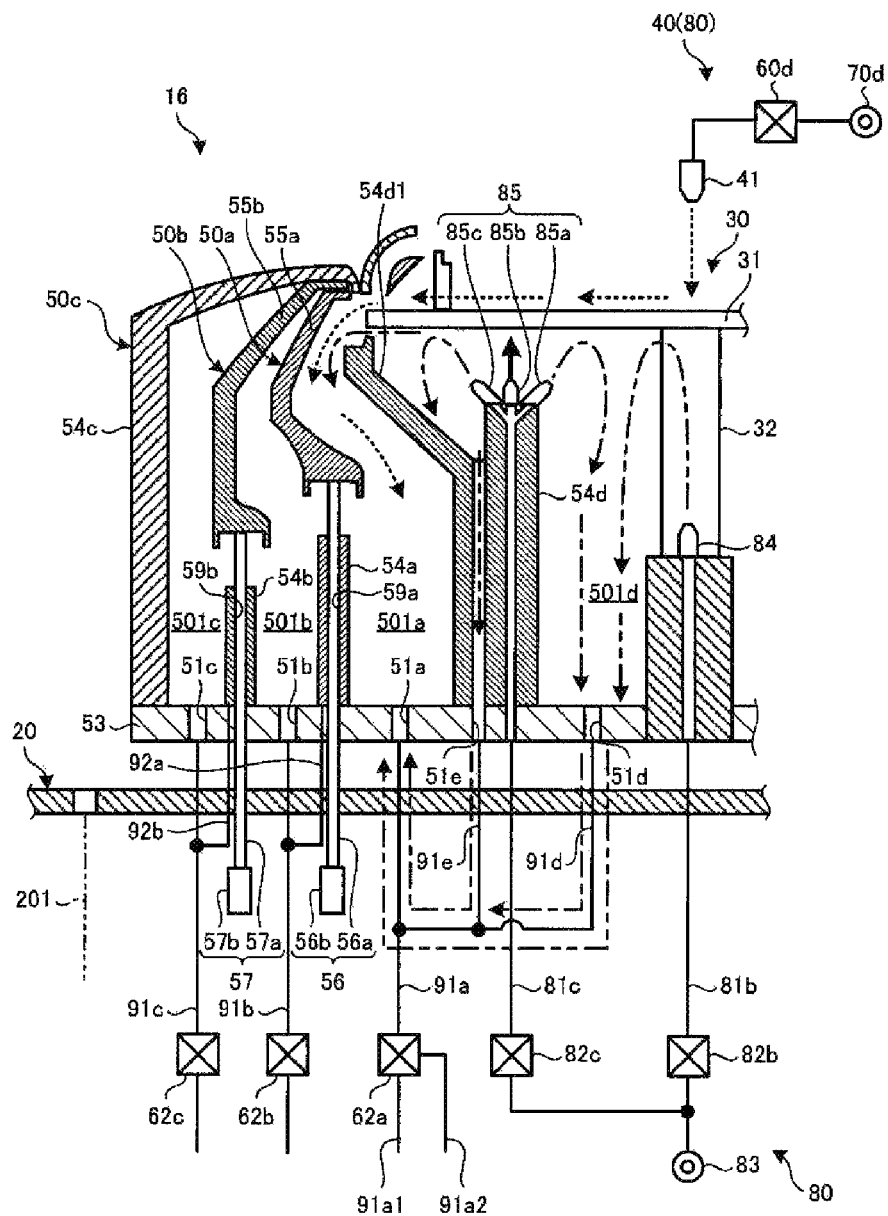
FIG. 7 is a schematic cross-sectional view illustrating an exemplary configuration of a processing unit according to first to third modifications.

FIG. 7 is a schematic cross-sectional view illustrating an exemplary configuration of a processing unit 16 according to first to third modifications. In the first to third modifications, the cleaning liquid supply pipe 81a or the valve 82a in the first exemplary embodiment is removed.

As illustrated in FIG. 7, in the first modification, a substrate cleaning liquid for cleaning a wafer W is supplied as the cleaning liquid L for cleaning the first peripheral wall portion 54ato the first drain groove 501a of the first cup 50a.

Specifically, the cleaning liquid supply unit 80 of the first modification includes a nozzle 41 that ejects the substrate cleaning liquid. The nozzle 41 is an example of the substrate nozzle. In addition, during the cleaning processing, the controller 18 of the control device 4 moves up the first and second cups 50a, 50b such that the first liquid receiving portion 55a is positioned at the processing position. Thus, a flow path is formed to lead from an opening inside the upper end of the first liquid receiving portion 55a to the first drain groove 501a.

In addition, the controller 18 opens the valve 60d to supply the substrate cleaning liquid (DIW) supplied from the DIW source 70d from the nozzle 41 to the holding unit 31. At this time, the controller 18 rotates the holding unit 31 by the driving unit 33 (see, e.g., FIG. 3).

Therefore, as indicated by the arrow of the broken line in FIG. 7, the substrate cleaning liquid supplied from the nozzle 41 to the holding unit 31 is shaken off toward the outer peripheral outside of the holding unit 31 by a centrifugal force accompanying the rotation of the holding unit 31, and the first liquid receiving portion 55a receives the substrate cleaning liquid scattered from the holding unit 31. The substrate cleaning liquid received in the first liquid receiving portion 55a flows downwardly into the first drain groove 501a, and the inflowing substrate cleaning liquid is used as the cleaning liquid L for cleaning the first peripheral wall portion 54a.

Accordingly, in the first modification, the processing fluid supply unit 40 functions as the cleaning liquid supply unit 80, and the nozzle 41 of the cleaning liquid supply unit 80 supplies the substrate cleaning liquid as the cleaning liquid L for cleaning the first peripheral wall portion 54ato the first drain groove 501a. Therefore, in the first modification, the cleaning liquid L may be supplied to the first drain groove 501a of the first cup 50a using, for example, the existing DIW source 70d or nozzle 41.

Next, the second and third modifications will be described. In the second and third modifications, a holding mechanism cleaning liquid for cleaning the substrate holding mechanism 30 including the holding unit 31 is supplied as the cleaning liquid L for cleaning the first peripheral wall portion 54ato the first drain groove 501a of the first cup 50a.

Specifically, in the processing unit 16 according to the second or third modification, the cleaning liquid supply unit 80 supplies the holding mechanism cleaning liquid to, for example, the substrate holding mechanism 30, for example, at a timing when each process of the substrate processing is performed, thereby cleaning, for example, the substrate holding mechanism 30.

Specifically, the cleaning liquid supply unit 80 includes nozzles 84, 85, cleaning liquid supply pipes 81b, 81c, and valves 82b, 82c. The nozzle 84 is disposed at a position directed to the support unit 32. The nozzle 84 is connected to the cleaning liquid source 83 through the cleaning liquid supply pipe 81b and the valve 82b.

The nozzle 85 is a nozzle for cleaning the rear surface of the holding unit 31, and is disposed, for example, in the vicinity of the upper end of the inner wall portion 54d. Further, the nozzle 85 includes first to third nozzles 85a to 85c.

The first nozzle 85a is disposed, for example, at a position directed to the vicinity of the central portion on the rear surface of the holding portion 31. Further, the second nozzle 85b is disposed at a position directed to a circumferentially outward side from the vicinity of the central portion of the rear surface of the holding portion 31, and the third nozzle 85c is disposed at a position directed to the vicinity of the peripheral portion of the rear surface of the holding portion 31. That is, the rear surface of the holding unit 31 is divided into three regions from the central portion toward the peripheral portion side, and the first to third nozzles 85a to 85c are directed to the respective regions.

Further, the nozzles 85a to 85c are connected to the cleaning liquid source 83 through the cleaning liquid supply pipe 81c and the valve 82c. In the example illustrated in FIG. 3, the first to third nozzles 85a to 85c are connected to the cleaning liquid supply pipe 81c branched in the middle, but the present disclosure is not limited thereto. Each of the first to third nozzles 85a to 85c may be connected to a separate cleaning liquid supply pipe. Further, in the above descriptions, the construction is made to include three (3) nozzles 85 (i.e., the nozzles 85a to 85c), but the number of nozzles is not limited thereto. The nozzles 84, 85 are an example of the holding mechanism nozzle that ejects the holding mechanism cleaning liquid.

Further, when the cleaning processing is performed on the support unit 32, the control device 4 opens the valve 82b to supply the holding mechanism cleaning liquid from the nozzle 84 to, for example, the support unit 32. In addition, when the cleaning processing is performed on the rear surface of the holding unit 31, the control device 4 opens the valve 82c to supply the holding mechanism cleaning liquid from the nozzle 85 to the rear surface of the holding unit 31.

Then, after the substrate holding mechanism 30 is cleaned, the holding mechanism cleaning liquid is dropped to, for example, a central drain groove 501d formed in the vicinity of the center on the inner circumferential side of the inner wall portion 54d, and is discharged from the central drain groove 501d to drain ports 51d, 51e formed in the bottom portion 53 of the recovery cup 50. Specifically, the drain port 51d has an opening, for example, provided at a circumferentially inward side from the inner wall portion 54d in the bottom portion 53, so that the holding mechanism cleaning liquid, which has flowed downwardly into the central drain groove 501d, flows into the opening.

Further, the drain port 51e has an opening provided in the vicinity of the proximal end of the extension 54d1 of the inner wall portion 54d, so that the holding mechanism cleaning liquid flowing from the extension 54d1 flows into the opening. The drain port 51d is connected to the drain pipe 91d, and the drain port 51e is connected to the drain pipe 91e. The drain pipes 91d, 91e are connected to the drain pipe 91a at a position on the upstream side in the flow direction of the drainage of the valve 62a.

During the cleaning processing of the substrate holding mechanism 30, the control device 4 controls the valve 62a to open the discharge path to the second drain pipe 91a1 side. Therefore, after the substrate holding mechanism 30 is cleaned, the holding mechanism cleaning liquid flows to the drain pipe 91a from the drain port 51d through the drain pipe 91d, or from the drain port 51e through the drain pipe 91e, and is then discharged to the outside of the processing unit 16 through the valve 62a and the second drain pipe 91a2.

Therefore, the holding mechanism cleaning liquid may be suppressed from flowing into the acidic processing liquid source 70b. Further, the processing unit 16 may be reduced in size by partially sharing the discharge path of the acidic processing liquid and the discharge path of the holding mechanism cleaning liquid.

In the second and third modifications, the cleaning processing of, for example the first peripheral wall portion 54a is performed in the processing unit 16 configured as described above. Specifically, in the second modification, the controller 18 opens the valve 82b to supply the holding mechanism cleaning liquid (DIW) from the nozzle 84 to, for example, the support unit 32.

Therefore, as indicated by the arrow of the alternate long and two short dashes line in FIG. 7, the holding mechanism cleaning liquid supplied to, for example, the support unit 32 is dropped into the central drain groove 501d and flows out from the drain port 51d to the drain pipe 91d. Further, in the cleaning processing of, for example, the first peripheral wall portion Ma, the valve 62a is closed as described above. Thus, the holding mechanism cleaning liquid flowing out from the central drain groove 501d to the drain pipe 91d flows from the drain port 54ainto the first drain groove 501a through the drain pipe 91a, and the inflowing holding mechanism cleaning liquid is used as the cleaning liquid L for cleaning the first peripheral wall portion 54a.

In the second modification, the nozzle 84 for cleaning, for example, the support unit 32 supplies the holding mechanism cleaning liquid as the cleaning liquid L for cleaning the first peripheral wall portion 54a to the first drain groove 501a of the first cup 50a. Therefore, since the configuration of cleaning the support unit 32 and the configuration of cleaning, for example, the first peripheral wall portion 54a are used in common, the processing unit 16 may be reduced in size and cost.

Next, descriptions will be made on operations of the processing unit in the third modification. In the third modification, the controller 18 moves up the first and second cups 50a, 50b such that the first liquid receiving portion 55a is positioned at the processing position. Thus, a flow path is formed to lead from an opening inside the upper end of the first liquid receiving portion 55a to the first drain groove 501a.

In addition, the controller 18 opens the valve 82c to supply the holding mechanism cleaning liquid (DIW), which is supplied from the cleaning liquid source 83, from the nozzle 85 to the rear surface of the holding unit 31. At this time, the controller 18 rotates the holding unit 31 by the driving unit 33.

Therefore, as indicated by the arrow of the alternate long and short dash line in FIG. 7, the holding mechanism cleaning liquid supplied to the rear surface of the holding unit 31 is dropped into the central drain groove 501d and flows out from the drain port 51d to the drain pipe 91d. Further, the holding mechanism cleaning liquid supplied to the rear surface of the holding unit 31 is also dropped into the extension 54d1, and flows out from the extension 54d1 to the drain pipe 91e through the drain port 51e. Then, since the valve 62a is closed, the holding mechanism cleaning liquid, which has flowed out to the drain pipes 91d, 91e, flows from the drain port 54a into the first drain groove 501a through the drain pipe 91a.

Further, the holding mechanism cleaning liquid supplied to the rear surface of the holding unit 31 is shaken off toward the outer peripheral outside of the holding unit 31 by a centrifugal force accompanying the rotation of the holding unit 31, and the first liquid receiving portion 55a receives the holding mechanism cleaning liquid scattered from the rear surface of the holding unit 31. The holding mechanism cleaning liquid received in the first liquid receiving portion 55a flows downwardly into the first drain groove 501a. The holding mechanism cleaning liquid, which has flowed into the first drain groove 501a as described above, is used as the cleaning liquid L for cleaning the first peripheral wall portion 54a.

In the third modification, the nozzle 85 for cleaning the rear surface of the holding unit 31 supplies the holding mechanism cleaning liquid as the cleaning liquid L for cleaning the first peripheral wall portion 54a to the first drain groove 501a of the first cup 50a. Therefore, since the configuration of cleaning the rear surface of the holding unit 31 and the configuration of cleaning, for example, the first peripheral wall portion 54a are used in common, the processing unit 16 may be reduced in size and cost.

The supply paths of the processing liquid L to the first drain groove 501a of the first exemplary embodiment and the first and third modifications may be appropriately combined. That is, for example, the first exemplary embodiment and the first modification may be combined such that the cleaning liquid L is supplied from both the cleaning liquid supply pipe 81a and the nozzle 41 to the first drainage groove 501a.

Further, in the exemplary embodiment and the respective modifications, the drain pipes 92a, 92b are provided to discharge the cleaning liquid L infiltrated into the insertion holes 59a, 59b of the first peripheral wall portion 54a and the second peripheral wall portion 54b, but the present disclosure is not limited thereto.

For example, the cleaning liquid L infiltrated into the insertion holes 59a, 59b of the first peripheral wall portion 54a and the second peripheral wall portion 54b may be leaked from the lower portion of the bottom portion 53 and received in the bottom portion of the chamber 20, without providing the drain pipes 92a, 92b. In this case, as indicated by the imaginary line in FIG. 7, a common drain pipe 201 is provided in the bottom portion of the chamber 20 to collectively discharge the cleaning liquid L received from the insertion holes 59a, 59b of the first peripheral wall portion 54a and the second peripheral wall portion 54b. With this configuration, the structure of the apparatus may be simplified and the cost may be reduced as compared with the case where the drain pipes 92a, 92 are provided.

(Second Exemplary Embodiment)

Subsequently, a substrate processing system 1 according to a second exemplary embodiment will be described. In the following descriptions, like parts will be denoted by the same reference numerals, and overlapping descriptions thereof will be omitted.

Figure 8:
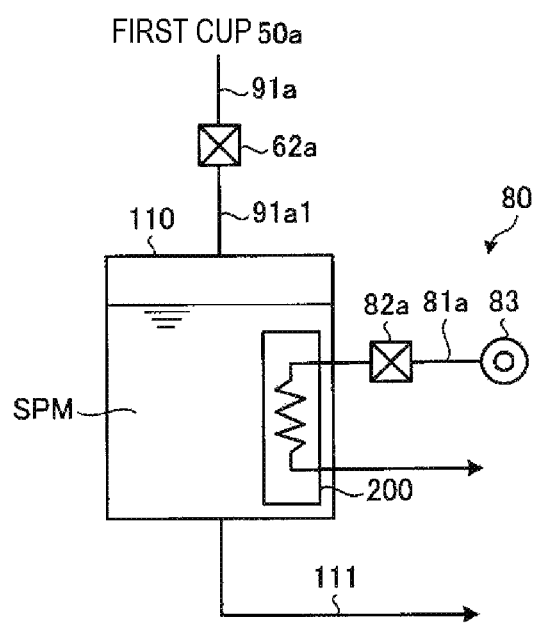
FIG. 8 is a schematic view illustrating an outline of a cleaning liquid supply unit according to a second exemplary embodiment.

In the second exemplary embodiment, foreign matters attached to, for example, the first peripheral wall portion 54a may be further reduced by heating the cleaning liquid L to a high temperature. FIG. 8 is a schematic view illustrating an outline of the cleaning liquid supply unit 80 according to the second exemplary embodiment.

As illustrated in FIG. 8, SPM is stored in the tank 110. The SPM becomes a relatively high-temperature mixed solution due to the reaction heat generated by the chemical reaction when sulfuric acid and hydrogen peroxide are mixed.

In the second exemplary embodiment, the tank 110 includes a heat exchange unit 200 to perform a heat exchange between the SPM (mixed solution) and the cleaning liquid L. The heat exchange unit 200 is provided in the tank 110, and is configured such that the cleaning liquid supply pipe 81a passes through the inside thereof.

Therefore, in the heat exchange unit 200, the cleaning liquid L of the cleaning liquid supply pipe 81a is heated to a high temperature by the relatively high-temperature SPM. Since the heated cleaning liquid L is likely to dissolve the crystals of ammonium sulfate as compared with the case before the heating, foreign matters such as the crystals attached to the first peripheral wall portion 54a may be further removed by using the hated cleaning liquid L in the cleaning processing.

In addition, in the above descriptions, the heat exchange unit 200 is provided in the tank 110, but the present disclosure is not limited thereto. That is, although not illustrated, for example, a coolant pipe through which a cooling medium (e.g., water) flows may be arranged in the tank 110, and the coolant pipe and the cleaning liquid supply pipe 81a may be connected to a heat exchange unit provided outside the tank 110. Even with the configuration, a heat exchange may be performed between the SPM and the cleaning liquid L so that the cleaning liquid L is heated to a high temperature.

Further, in the second exemplary embodiment, the cleaning liquid L flowing through the cleaning liquid supply pipe 81a is heated, but the present disclosure is not limited thereto. For example, in the first to third modifications, the substrate cleaning liquid or the holding mechanism cleaning liquid, which is used as the cleaning liquid L, may be heated.

Further, in the above exemplary embodiments, the cleaning liquid L overflows from the first drain groove 501a of the first cup 50a to the second cup 50b and the third cup 50c, but the present disclosure is not limited thereto.

That is, the cleaning liquid L may overflow from the second drain groove 501b of the second cup 50b to the first cup 50a or the third cup 50c. Alternatively, the cleaning liquid L may overflow from the third drain groove 501c of the third cup 50c to the second cup 50b and the first cup 50a. Further, the cleaning liquid L may overflow from the first drain groove 501a of the first cup 50a to the second cup 50b, but not to the third cup 50c by opening the valve 62b.

Further, in the processing unit 16 described above, the acidic processing liquid is recovered through the first drain pipe 91a1 and is reused, but the present disclosure is not limited thereto. The acidic processing liquid may not be reused. Further, in the above descriptions, the first lift driving unit 56b and the second lift driving unit 57b are separate members, but the present disclosure is not limited thereto. For example, the first and second lift driving units 56b, 57b may be a common member.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A substrate processing apparatus comprising:
a substrate holder configured to hold a substrate;

a processing liquid supply source configured to supply a first processing liquid and a second processing liquid to the substrate;
a first cup including a liquid receiving portion and a peripheral wall portion that extends below the liquid receiving portion, the liquid receiving portion being movable up and down with respect to the peripheral wall portion, the first cup configured to recover the first processing liquid;
a second cup disposed adjacent to and radially outward from the first cup and configured to recover the second processing liquid;
a recovery portion defined by the peripheral wall portion, the recovery portion connected to a drain pipe configured to discharge the first processing fluid through the drain pipe in a first direction;
a cleaning liquid supply source connected to the drain pipe and configured to supply a cleaning liquid to the recovery portion through the drain pipe in a second direction opposite the first direction; and
an inner wall separate from the second cup and positioned on an inner peripheral side of the first cup,
wherein the peripheral wall portion is cleaned by causing the cleaning liquid supplied by the cleaning liquid supply source to overflow from the peripheral wall portion to a second cup side, and when the liquid receiving portion is in a retreat position, the liquid receiving portion is configured to contact an upper portion of the inner wall thereby closing a flow path to the drain pipe.

2. The substrate processing apparatus of claim 1, wherein the liquid receiving portion surrounds a periphery of the substrate held by the substrate holder and is configured to receive the first processing liquid scattered from the substrate, and
the cleaning liquid supplied by the cleaning liquid supply source is caused to overflow from a gap between the peripheral wall portion and the liquid receiving portion to the second cup side.

3. The substrate processing apparatus of claim 2, wherein the liquid receiving portion is moved down to such an extent that a part of the liquid receiving portion, which faces an upper surface of the peripheral wall portion, is cleaned by the cleaning liquid when the cleaning liquid overflows from the peripheral wall portion.

4. The substrate processing apparatus of claim 2, wherein the first cup further includes a support configured to support the liquid receiving portion, and move up and down the liquid receiving portion with respect to the peripheral wall portion, and an insertion hole formed inside the peripheral wall portion to allow the support to be inserted therethrough, and
the cleaning liquid supply source is configured to clean the support by introducing the cleaning liquid overflowing from the peripheral wall portion into the insertion hole.

5. The substrate processing apparatus of claim 1, wherein the first cup is connected to a circulation line that circulates the recovered first processing liquid and supplies to the substrate again, and
the second cup is connected to a drain line that discharges the recovered second processing liquid to the outside of the apparatus.

6. The substrate processing apparatus of claim 5, further comprising:
a valve configured to control the discharge of the first processing liquid from the drain pipe,
wherein the cleaning liquid supply source supplies the cleaning liquid from the drain pipe to the recovery portion when the cleaning liquid supply source is connected to the drain pipe at a position of an upstream side of the valve in a flow direction and the valve is closed.

7. The substrate processing apparatus of claim 1, further comprising:
a third cup disposed on an opposite side to the first cup across the second cup, and configured to recover a third processing liquid supplied from the processing liquid supply unit,
wherein a second recovery portion is defined between the peripheral wall portion and a second peripheral wall portion that is erected on a bottom portion of the second cup on an outer peripheral side of the peripheral wall portion,
the cleaning liquid overflowing from the peripheral wall portion to the second cup side is recovered through the second recovery portion, and
the second peripheral wall portion is cleaned by causing some of the recovered cleaning liquid to overflow from the second peripheral wall portion to the third cup side.

8. The substrate processing apparatus of claim 1, further including a substrate nozzle configured to eject a substrate cleaning liquid to clean the substrate.

9. The substrate processing apparatus of claim 1, further including a holder nozzle configured to eject a cleaning liquid to clean the substrate holder.

10. The substrate processing apparatus of claim 1, wherein the first processing liquid includes a mixed solution of sulfuric acid and hydrogen peroxide, and
a heat exchanger is further provided to perform a heat exchange between the mixed solution and the cleaning liquid.

11. A method of cleaning a substrate liquid processing apparatus including: a substrate holder configured to hold a substrate; a processing liquid supply source configured to supply a first processing liquid and a second processing liquid to the substrate; a first cup including a liquid receiving portion and a peripheral wall portion that extends below the liquid receiving portion, the liquid receiving portion being movable up and down with respect to the peripheral wall portion, the first cup configured to recover the first processing liquid; a second cup disposed adjacent to and radially outward from the first cup and configured to recover the second processing liquid; a recovery portion defined by the peripheral wall portion that is erected on a bottom portion of the first cup and connected to a drain pipe configured to discharge the first processing fluid through the drain pipe in a first direction; a cleaning liquid supply source configured to supply a cleaning liquid to the recovery portion; and an inner wall separate from the second cup and positioned on an inner peripheral side of the first cup,
the method comprising:
supplying the cleaning liquid from the cleaning liquid supply unit to the recovery portion through the drain pipe in a second direction opposite the first direction;
causing the supplied cleaning liquid to overflow from the peripheral wall portion to the second cup side so as to clean the peripheral wall portion; and
moving the liquid receiving portion to a retreat position to contact an upper portion of the inner wall thereby closing a flow path to the drain pipe.

12. The method of claim 11, wherein the liquid receiving portion surrounds a periphery of the substrate held by the substrate holder and is configured to receive the first processing liquid scattered from the substrate, and the cleaning liquid supplied by the cleaning liquid supply source is caused to overflow from a gap between the peripheral wall portion and the liquid receiving portion to the second cup side.

13. The method of claim 12, wherein the first cup further includes a support member configured to support the liquid receiving portion and an insertion hole formed inside the peripheral wall portion to allow the support member to be inserted therethrough, and the support member is cleaned by introducing the cleaning liquid overflowing from the peripheral wall portion into the insertion hole.

* * * * *